US011527699B2

(12) United States Patent
Hamada et al.

(10) Patent No.: US 11,527,699 B2
(45) Date of Patent: Dec. 13, 2022

(54) PIEZOELECTRIC ELEMENT, LIQUID DISCHARGE HEAD, AND PRINTER

(71) Applicant: Seiko Epson Corporation, Tokyo (JP)

(72) Inventors: Yasuaki Hamada, Chino (JP); Tomohiro Sakai, Matsumoto (JP)

(73) Assignee: SEIKO EPSON CORPORATION

( * ) Notice: Subject to any disclaimer, the term of this patent is extended or adjusted under 35 U.S.C. 154(b) by 0 days.

(21) Appl. No.: 17/361,410

(22) Filed: Jun. 29, 2021

(65) Prior Publication Data

US 2021/0408361 A1  Dec. 30, 2021

(30) Foreign Application Priority Data

Jun. 30, 2020 (JP) .............................. JP2020-112531

(51) Int. Cl.
| | |
|---|---|
| *H01L 41/00* | (2013.01) |
| *H01L 41/04* | (2006.01) |
| *H01L 41/09* | (2006.01) |
| *B41J 2/14* | (2006.01) |
| *H01L 41/187* | (2006.01) |

(52) U.S. Cl.
CPC ........ *H01L 41/042* (2013.01); *B41J 2/14233* (2013.01); *H01L 41/0973* (2013.01); *H01L 41/1873* (2013.01); *B41J 2002/14419* (2013.01)

(58) Field of Classification Search
None
See application file for complete search history.

(56) References Cited

U.S. PATENT DOCUMENTS

| | | | | |
|---|---|---|---|---|
| 2009/0026513 | A1* | 1/2009 | Johansson | ........... H01L 21/3127 427/255.6 |
| 2014/0091677 | A1* | 4/2014 | Noda | .................... H01L 41/081 310/365 |
| 2017/0062693 | A1* | 3/2017 | Sakai | .................. H01L 41/1873 |
| 2017/0062697 | A1* | 3/2017 | Sakai | .................. B41J 2/14233 |

FOREIGN PATENT DOCUMENTS

| | | | | |
|---|---|---|---|---|
| JP | 2010-138066 A | | 6/2010 | |
| JP | 2011187672 A | * | 9/2011 | .......... B41J 2/14201 |
| JP | 2014177094 A | * | 9/2014 | .............. B28B 1/30 |
| WO | WO-2014086611 A1 | * | 6/2014 | .......... H01L 41/042 |

* cited by examiner

*Primary Examiner* — Erica S Lin
(74) *Attorney, Agent, or Firm* — Harness, Dickey & Pierce, P.L.C.

(57) ABSTRACT

A piezoelectric element includes: a first electrode and a second electrode; and a piezoelectric layer provided between the first electrode and the second electrode and having a perovskite structure, in which $0 < P1/P2 \leq 0.5$ and $0 < P1$ where, when a positive predetermined voltage is applied to the piezoelectric layer, then a voltage applied to the piezoelectric layer is set to 0 V for 0.1 seconds, and then a triangular wave voltage waveform having a maximum voltage of the predetermined voltage is applied to the piezoelectric layer to obtain a hysteresis curve drawn counterclockwise, P1 is a residual polarization amount at a start point of the hysteresis curve and P2 is a residual polarization amount at an end point of the hysteresis curve.

5 Claims, 8 Drawing Sheets

| | P1 [μC/cm²] | P2 [μC/cm²] | P1/P2 | P3 [μC/cm²] | PIEZOELECTRIC CONSTANT $d_{31}$ [pm/V] | LEAK CURRENT [A/cm²] |
|---|---|---|---|---|---|---|
| EXAMPLE 1 | 0.1 | 0.6 | 0.17 | 0.0 | −97 | 8.0E−08 |
| EXAMPLE 2 | 5.3 | 11.4 | 0.46 | 5.2 | −107 | 4.0E−08 |
| COMPARATIVE EXAMPLE 1 | −0.5 | 0.2 | −2.50 | −0.7 | −63 | 3.0E−06 |
| COMPARATIVE EXAMPLE 2 | 12.1 | 15.7 | 0.77 | − | − | 9.0E−06 |

PIEZOELECTRIC ELEMENT, LIQUID DISCHARGE HEAD, AND PRINTER

The present application is based on, and claims priority from JP Application Serial Number 2020-112531, filed Jun. 30, 2020, the disclosure of which is hereby incorporated by reference herein in its entirety.

BACKGROUND

1. Technical Field

The present disclosure relates to a piezoelectric element, a liquid discharge head, and a printer.

2. Related Art

Currently, a piezoelectric element is used in various fields such as a liquid discharge head or a sensor for an inkjet printer. As a piezoelectric material, for example, sodium potassium niobate or lead zirconate titanate is used. Such a piezoelectric material is known to have remanent polarization.

For example, JP-A-2010-138066 describes that it is necessary to increase the remanent polarization in order to obtain high characteristics in the piezoelectric element.

However, in the piezoelectric element having large remanent polarization, piezoelectric characteristics may fluctuate due to an imprint phenomenon in which an offset voltage is applied in a piezoelectric layer.

SUMMARY

A piezoelectric element according to an aspect of the present disclosure includes: a first electrode and a second electrode; and a piezoelectric layer provided between the first electrode and the second electrode and having a perovskite structure, in which $0<P1/P2\leq0.5$ and $0<P1$ where, when a positive predetermined voltage is applied to the piezoelectric layer, then a voltage applied to the piezoelectric layer is set to 0 V for 0.1 seconds, and then a triangular wave voltage waveform having a maximum voltage of the predetermined voltage is applied to the piezoelectric layer to obtain a hysteresis curve drawn counterclockwise, P1 is a residual polarization amount at a start point of the hysteresis curve and P2 is a residual polarization amount at an end point of the hysteresis curve.

DESCRIPTION OF EXEMPLARY EMBODIMENTS

Hereinafter, preferred embodiments of the present disclosure will be described in detail with reference to drawings. The embodiments described below do not unreasonably limit contents of the present disclosure described in the appended claims. Not all configurations to be described below are necessary components of the present disclosure.

1. Piezoelectric Element

1.1. Configuration

Figure 1:
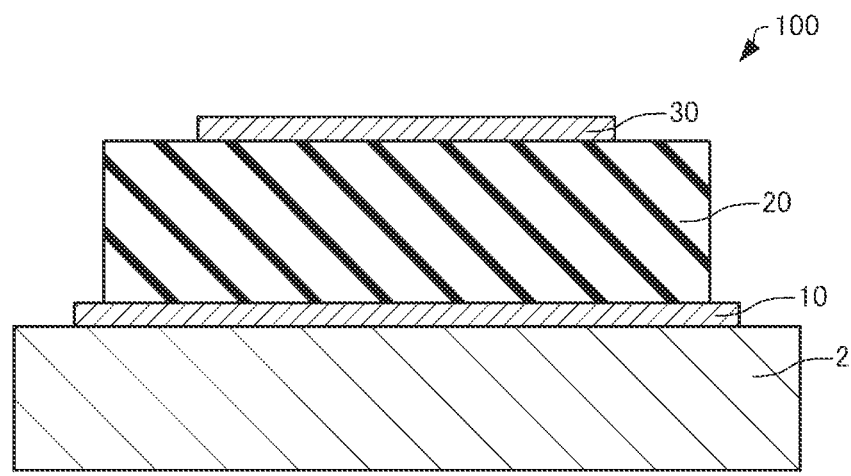
FIG. 1 is a cross-sectional view schematically showing a piezoelectric element according to an embodiment.

First, a piezoelectric element according to the present embodiment will be described with reference to the drawings. FIG. 1 is a cross-sectional view schematically showing a piezoelectric element 100 according to the present embodiment.

As shown in FIG. 1, the piezoelectric element 100 includes a first electrode 10, a piezoelectric layer 20, and a second electrode 30. The piezoelectric element 100 is provided at a substrate 2.

The substrate 2 is, for example, a flat plate made of a semiconductor, an insulator, or the like. The substrate may be a single layer or a laminated body in which a plurality of layers are laminated. An internal structure of the substrate 2 is not limited as long as an upper surface has a flat shape, and the substrate 2 may have a structure in which a space or the like is defined inside.

The substrate 2 may include a diaphragm that has flexibility and deforms by an operation of the piezoelectric layer 20. The diaphragm is, for example, a silicon oxide layer, a zirconium oxide layer, or a laminated body in which the zirconium oxide layer is provided at the silicon oxide layer.

The first electrode 10 is provided at the substrate 2. The first electrode 10 is provided between the substrate and the piezoelectric layer 20. A shape of the first electrode 10 is, for example, a layered shape. A thickness of the first electrode 10 is, for example, 3 nm or more and 300 nm or less. The first electrode 10 is, for example, a metal layer such as a platinum layer, an iridium layer, a titanium layer, or a ruthenium layer, a conductive oxide layer of these metals, a lanthanum nickelate ($LaNiO_3$: LNO) layer, a strontium ruthenate ($SrRuO_3$: SRO) layer, or the like. The first electrode 10 may have a structure in which the layers described above are laminated for a plurality of layers.

The first electrode 10 is an electrode for applying a voltage to the piezoelectric layer 20. The first electrode is a bottom electrode provided under the piezoelectric layer 20.

The piezoelectric layer 20 is provided at the first electrode 10. The piezoelectric layer 20 is provided between the first electrode 10 and the second electrode 30. Although not shown, the piezoelectric layer 20 may be provided at the first electrode 10 and the substrate 2. A thickness of the piezoelectric layer 20 is, for example, 100 nm or more and 3 μm or less. The piezoelectric layer 20 can be deformed by applying a voltage between the first electrode 10 and the second electrode 30.

The piezoelectric layer 20 has a perovskite structure. The piezoelectric layer 20 is, for example, a KNN layer including potassium (K), sodium (Na), and niobium (Nb). In the piezoelectric layer 20, a ratio $D_A/D_B$ of an atomic concentration $D_A$ of an A site to an atomic concentration $D_B$ of a B site is, for example, 1.01 or more and 1.10 or less, preferably 1.02 or more and 1.06 or less. When the piezoelectric layer 20 is the KNN layer, in the piezoelectric layer 20, a total of the number of atoms of the potassium and the number of atoms of the sodium is larger than the number of atoms of the niobium by, for example, 1% or more and 10% or less, preferably 2% or more and 6% or less.

The second electrode 30 is provided at the piezoelectric layer 20. Although not shown, the second electrode 30 may be further provided on a side surface of the piezoelectric layer 20 and at the substrate 2 as long as the second electrode 30 is electrically separated from the first electrode 10.

A shape of the second electrode 30 is, for example, a layered shape. A thickness of the second electrode 30 is, for example, 3 nm or more and 300 nm or less. The second electrode 30 is, for example, a metal layer such as an iridium layer, a platinum layer, a titanium layer, or a ruthenium layer, the conductive oxide layer of these metals, a lanthanum nickelate layer, a strontium ruthenate layer, or the like. The second electrode 30 may have a structure in which the layers described above are laminated for a plurality of layers.

The second electrode 30 is the other electrode for applying a voltage to the piezoelectric layer 20. The second electrode 30 is an upper electrode provided above the piezoelectric layer 20.

1.2. Hysteresis Curve

Figure 2:
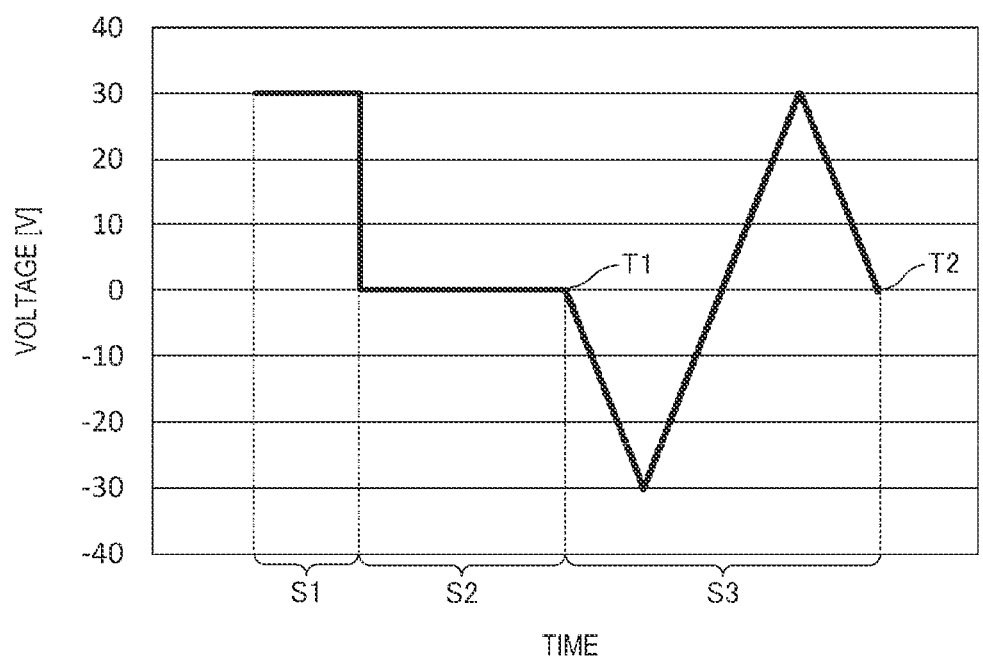
FIG. 2 is a graph showing a voltage applied to a piezoelectric layer in order to obtain a hysteresis curve.
Figure 3:
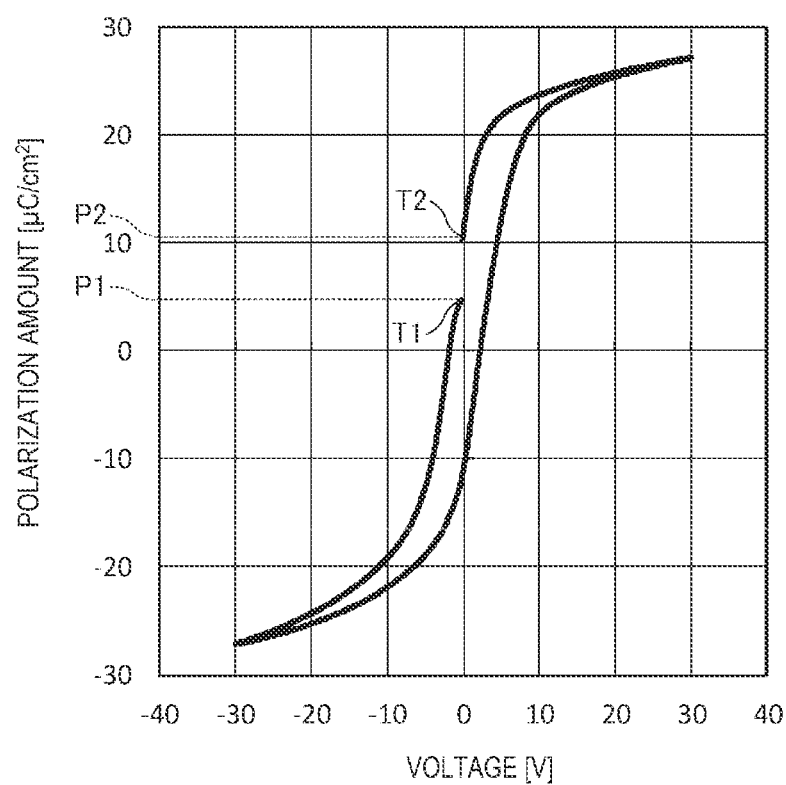
FIG. 3 is the hysteresis curve of the piezoelectric element obtained by a voltage waveform shown in FIG. 2.

FIG. 2 is a graph showing the voltage applied to the piezoelectric layer 20 in order to obtain a hysteresis curve. FIG. 3 is the hysteresis curve of the piezoelectric element 100 obtained by a voltage waveform shown in FIG. 2.

In order to obtain the hysteresis curve shown in FIG. 3, first, as shown in FIG. 2, a positive predetermined voltage is applied to the piezoelectric layer 20 for a predetermined period (step S1). Specifically, the predetermined period is 1 millisecond. In an example shown in FIG. 2, +30 V is applied. Here, a "positive voltage" is a voltage at which the first electrode 10 is positive with respect to the second electrode 30. A "negative voltage" is a voltage at which the first electrode 10 is negative with respect to the second electrode 30.

Next, the voltage applied to the piezoelectric layer 20 is set to 0 V for 0.1 seconds (step S2).

Next, a triangular wave voltage waveform is applied to the piezoelectric layer 20 to obtain the hysteresis curve (step S3). A triangular wave is a waveform that draws the hysteresis curve counterclockwise. That is, as shown in FIG. 2, the triangular wave has a waveform of 0 V, the negative voltage, 0 V, the positive voltage, and 0 V. In the example, a start point of the triangular wave is T1 and an end point of the triangular wave is T2. An applied voltage at the start point T1 and the end point T2 is 0 V. A maximum positive voltage applied to the piezoelectric layer 20 by the triangular wave is the predetermined voltage applied in step S1. In the example, the maximum positive voltage is +30 V. An absolute value of a maximum negative voltage applied to the piezoelectric layer 20 by the triangular wave is the same as an absolute value of the maximum positive voltage. In the example, the maximum negative voltage is −30 V.

As shown in FIG. 3, assuming that a residual polarization amount at the start point T1 of the hysteresis curve is P1 and a residual polarization amount at the end point T2 of the hysteresis curve is P2, the piezoelectric element 100 satisfies the following equation 1.

$$0 < P1/P2 \leq 0.5 \text{ and } 0 < P1 \quad (1)$$

As described above, the piezoelectric layer 20 has the perovskite structure, and the ratio $D_A/D_B$ of the atomic concentration $D_A$ of the A site to the atomic concentration $D_B$ of the B site is 1.01 or more and 1.10 or less, preferably 1.02 or more and 1.06 or less. As described above, by making the piezoelectric layer 20 a composition having the perovskite structure that is not chemical bilateral composition, the piezoelectric layer 20 has a defect. Since a part of the remanent polarization is lost due to a leakage current caused by this defect, the piezoelectric element 100 can satisfy the equation 1.

A method for forming the defect in the piezoelectric layer 20 is not limited to a method for setting the ratio $D_A/D_B$ in the above range. For example, when the piezoelectric layer is the KNN layer, the defect may be formed by removing potassium atoms or sodium atoms in a crystal lattice from the crystal lattice by a heat treatment. Thereby, the hysteresis curve satisfying the equation 1 can be obtained.

Further, impurities may be introduced into the piezoelectric layer 20 and a part of the remanent polarization may be lost due to the leakage current caused by the introduced impurities. As a result, the piezoelectric element 100 may satisfy the equation 1. The impurities may be introduced by substituting elements having different valences in the A site or the B site of the perovskite structure, or by adding a light element that easily moves in the layer. When the piezoelectric layer 20 is the KNN layer, examples of the elements having different valences include +1-valent K, +2-valent Ca with respect to Na, and +4-valent Ti with respect to +5-valent Nb. Examples of the light element that easily moves include K, Na, B, and Li.

The piezoelectric element 100 may satisfy the equation 1 by introducing a space charge that cancels polarization into the piezoelectric layer 20.

1.3. Operation Effect

In the piezoelectric element 100, when the positive predetermined voltage is applied to the piezoelectric layer 20, then the voltage applied to the piezoelectric layer 20 is set to 0 V for 0.1 seconds, and then the triangular wave voltage waveform having a maximum voltage of the predetermined voltage is applied to the piezoelectric layer 20 to obtain the hysteresis curve drawn counterclockwise, $0 < P1/P2 \leq 0.5$ and $0 < P1$ are satisfied assuming that the residual polarization amount at the start point T1 of the hysteresis curve is P1 and the residual polarization amount at the end point T2 of the hysteresis curve is P2.

As described above, in the piezoelectric element 100, since $P1/P2 \leq 0.5$, an imprint phenomenon in which the offset voltage is applied to the piezoelectric layer can be prevented as compared with when P1/P2 is larger than 0.5. The offset voltage gradually increases in a long term since a magnitude of the remanent polarization is accumulated and increased by holding time or the number of holdings. Therefore, piezoelectric characteristics fluctuate, which causes a problem of reliability.

Further, in the piezoelectric element 100, since $0 < P1/P2$, the absolute value of a piezoelectric constant is larger than that when P1/P2 is zero or less. When P1/P2 is zero or less, a polarization state becomes unknown. Therefore, for example, when the positive voltage is applied to drive the piezoelectric element, electrical energy is used to determine a polarization direction, which causes a corresponding loss and leads to a delay in driving and a decrease in the piezoelectric characteristics.

As described above, the piezoelectric element 100 satisfies $0<P1/P2\leq0.5$ and $P1>0$, so that the absolute value of the piezoelectric constant is large and a fluctuation of the piezoelectric characteristics due to the imprint phenomenon can be prevented.

2. Method for Manufacturing Piezoelectric Element

Next, a method for manufacturing the piezoelectric element 100 according to the present embodiment will be described with reference to the drawings.

As shown in FIG. 1, the substrate 2 is prepared. Specifically, a silicon oxide layer is formed by thermally oxidizing a silicon substrate. Next, a zirconium layer is formed at the silicon oxide layer by a sputtering method or the like, and the zirconium oxide layer is formed by thermally oxidizing a zirconium layer. As a result, a diaphragm formed of the silicon oxide layer and the zirconium oxide layer can be formed. The substrate 2 can be prepared by the above steps.

Next, the first electrode 10 is formed at the substrate 2. The first electrode 10 is formed by, for example, the sputtering method or a vacuum vapor deposition method. Next, the first electrode 10 is patterned. Patterning is performed, for example, by photolithography and etching.

Next, the piezoelectric layer 20 is formed at the first electrode 10. The piezoelectric layer 20 is formed by a chemical solution deposition (CSD) method such as a sol-gel method or a metal organic deposition (MOD). Hereinafter, a method for forming the piezoelectric layer 20 will be described.

First, for example, a metal complex containing potassium, a metal complex containing sodium, and a metal complex containing niobium are dissolved or dispersed in an organic solvent to prepare a precursor solution.

Examples of the metal complex containing the potassium include potassium 2-ethylhexanoate and potassium acetate. Examples of the metal complex containing the sodium include sodium 2-ethylhexanoate and sodium acetate. Examples of the metal complex containing the niobium include niobium 2-ethylhexanoate, niobium ethoxydo, pentaethoxyniobium, and pentabtoxiniobium. Two or more kinds of metal complexes may be used in combination. For example, as the metal complex containing the potassium, potassium 2-ethylhexanoate and the potassium acetate may be used in combination.

Examples of the solvent include propanol, butanol, pentanol, hexanol, octanol, ethylene glycol, propylene glycol, octane, decane, cyclohexane, xylene, toluene, tetrahydrofuran, acetic acid, octyl acid, 2-n butoxyethanol, n-octane, 2-n ethyl hexane, or a mixed solvent thereof.

Next, the prepared precursor solution is applied onto the first electrode 10 by a spin coating method or the like to form a precursor layer. Next, the precursor layer is heated at, for example, 130° C. or higher and 250° C. or lower and dried for a certain period of time, and the dried precursor layer is further degreased by being heated at, for example, 300° C. or higher and 450° C. or lower and held for a certain period of time. Next, the degreased precursor layer is crystallized by firing at, for example, 550° C. or higher and 800° C. or lower to form a crystal layer.

Then, a series of steps from the application of the precursor solution to the firing of the precursor layer is repeated a plurality of times. As a result, the piezoelectric layer 20 formed of a plurality of crystal layers can be formed. Next, the piezoelectric layer 20 is patterned. The patterning is performed, for example, by the photolithography and the etching. The piezoelectric layer 20 formed of one crystal layer may be formed without repeating the series of steps from the application of the precursor solution to the firing of the precursor layer the plurality of times.

A heating device used for drying and degreasing the precursor layer is, for example, a hot plate. The heating device used for firing the precursor layer is, for example, a rapid thermal annealing (RTA) device.

Next, the second electrode 30 is formed at the piezoelectric layer 20. The second electrode 30 is formed by, for example, the sputtering method or the vacuum vapor deposition method. Next, the second electrode 30 is patterned. The patterning is performed, for example, by the photolithography and the etching.

The piezoelectric element 100 can be manufactured by the above steps.

The patterning of the second electrode 30 and the patterning of the piezoelectric layer 20 may be performed in the same step. When the piezoelectric layer 20 is formed of a plurality of crystal layers, a first crystal layer of the piezoelectric layer 20 and the first electrode 10 may be patterned in the same step.

3. Liquid Discharge Head

Figure 4:
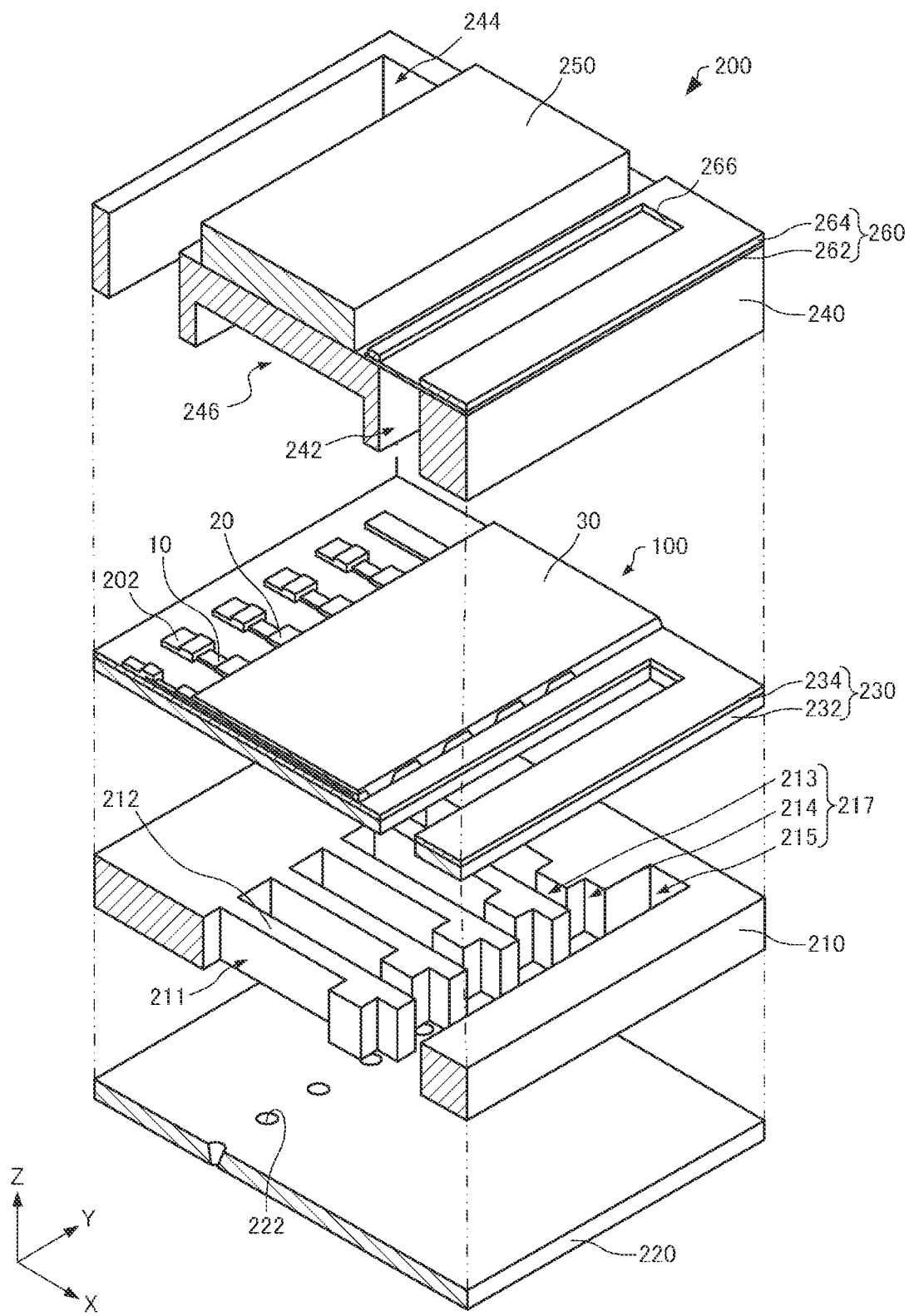
FIG. 4 is an exploded perspective view schematically showing a liquid discharge head according to the present embodiment.
Figure 5:
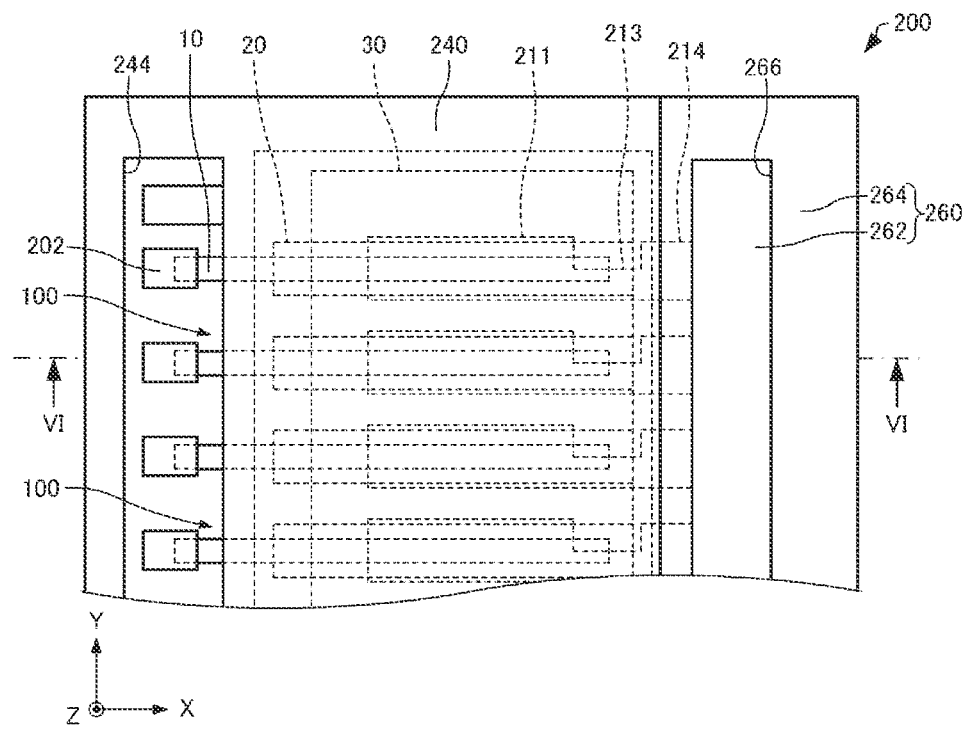
FIG. 5 is a plan view schematically showing the liquid discharge head according to the present embodiment.
Figure 6:
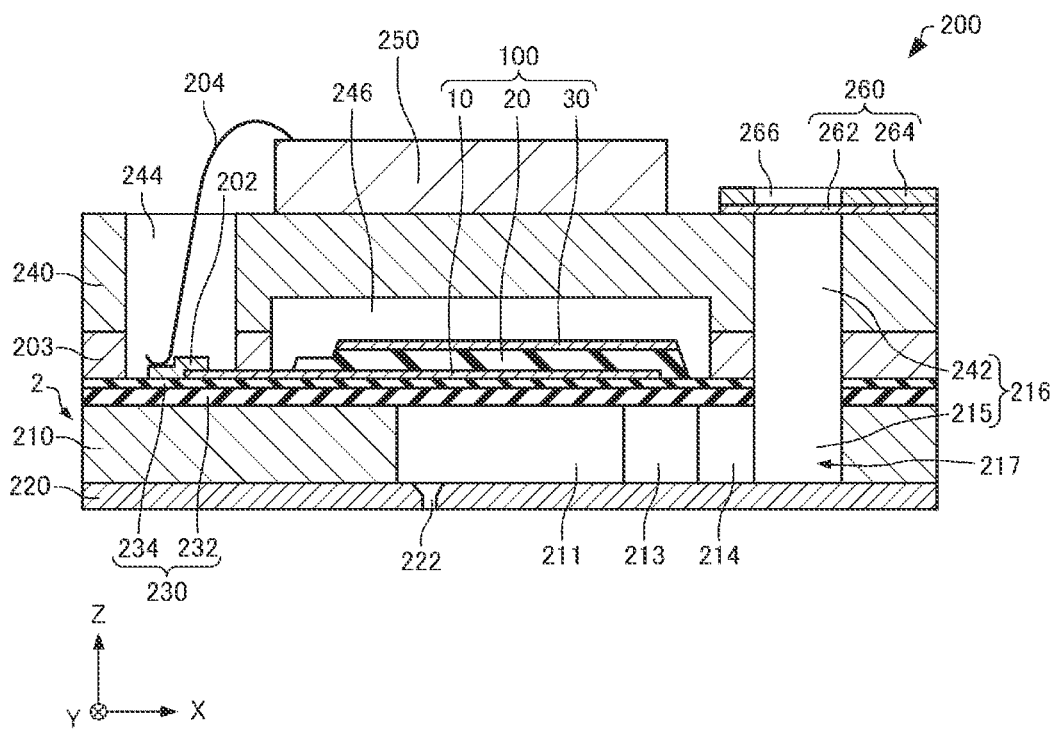
FIG. 6 is a cross-sectional view schematically showing the liquid discharge head according to the present embodiment.

Next, a liquid discharge head according to the present embodiment will be described with reference to the drawings. FIG. 4 is an exploded perspective view schematically showing a liquid discharge head 200 according to the present embodiment. FIG. 5 is a plan view schematically showing the liquid discharge head 200 according to the present embodiment. FIG. 6 is a cross-sectional view taken along a line VI-VI of FIG. 5 schematically showing the liquid discharge head 200 according to the present embodiment. In FIGS. 4 to 6, an X-axis, a Y-axis, and a Z-axis are shown as three axes orthogonal to each other. Further, in FIGS. 4 and 6, the piezoelectric element 100 is shown in a simplified manner.

As shown in FIGS. 4 to 6, the liquid discharge head 200 includes, for example, the substrate 2, the piezoelectric element 100, a nozzle plate 220, a protective substrate 240, a circuit board 250, and a compliance substrate 260. The substrate 2 includes a flow path forming substrate 210 and a diaphragm 230. For convenience, FIG. 5 omits the circuit board 250.

The flow path forming substrate 210 is, for example, a silicon substrate. The flow path forming substrate 210 is provided with a pressure generating chamber 211. The pressure generating chamber 211 is partitioned by a plurality of partition walls 212. A volume of the pressure generating chamber 211 changes depending on the piezoelectric element 100.

A first communication passage 213 and a second communication passage 214 are provided at an end of the flow path forming substrate 210 in a +X axis direction of the pressure generating chamber 211. The first communication passage 213 is configured such that an opening area thereof is reduced by narrowing the end of the pressure generating chamber 211 in the +X axis direction from a Y axis direction. A width of the second communication passage 214 in the Y axis direction is, for example, the same as a width of the pressure generating chamber 211 in the Y axis direction. In the +X axis direction of the second communication passage 214, a third communication passage 215 communicating with a plurality of second communication passages 214 is provided. The third communication passage 215 constitutes a part of a manifold 216. The manifold 216 serves as a common liquid chamber for the pressure generating chamber 211. As described above, the flow path forming substrate 210 is provided with the pressure generating chamber 211 and a supply flow path 217 including the first communication passage 213, the second communication passage 214, and the third communication passage 215. The supply flow path 217 communicates with the pressure generating chamber 211 and supplies a liquid to the pressure generating chamber 211.

The nozzle plate 220 is provided on one side surface of the flow path forming substrate 210. A material of the nozzle plate 220 is, for example, a steel use stainless (SUS). The nozzle plate 220 is joined to the flow path forming substrate 210 by, for example, an adhesive or a heat welding film. The nozzle plate 220 is provided with a plurality of nozzle holes 222 along the Y axis. The nozzle holes 222 communicate with the pressure generating chamber 211 and discharge the liquid.

The diaphragm 230 is provided on the other side surface of the flow path forming substrate 210. The diaphragm 230 is formed of, for example, a silicon oxide layer 232 provided at the flow path forming substrate 210 and a zirconium oxide layer 234 provided at the silicon oxide layer 232.

The piezoelectric element 100 is provided at the diaphragm 230, for example. A plurality of piezoelectric elements 100 are provided. The number of the piezoelectric elements 100 is not particularly limited.

In the liquid discharge head 200, the diaphragm 230 and the first electrode 10 are displaced by deformation of the piezoelectric layer 20 having an electromechanical conversion characteristic. That is, in the liquid discharge head 200, the diaphragm 230 and the first electrode 10 substantially have a function as a diaphragm.

The first electrode 10 serves as an independent individual electrode for the pressure generating chamber 211. A width of the first electrode 10 in the Y axis direction is smaller than the width of the pressure generating chamber 211 in the Y axis direction. A length of the first electrode 10 in an X axis direction is larger than a length of the pressure generating chamber 211 in the X axis direction. In the X axis direction, both ends of the first electrode 10 sandwich both ends of the pressure generating chamber 211. A lead electrode 202 is coupled to the end of the first electrode 10 in an −X axis direction.

A width of the piezoelectric layer 20 in the Y axis direction is larger than the width of the first electrode 10 in the Y axis direction. A length of the piezoelectric layer 20 in the X axis direction is larger than the length of the pressure generating chamber 211 in the X axis direction. The end of the first electrode 10 in the +X axis direction is located, for example, between an end of the piezoelectric layer 20 in the +X axis direction and the end of the pressure generating chamber 211 in the +X axis direction. The end of the first electrode 10 in the +X axis direction is covered with the piezoelectric layer 20. On the other hand, an end of the piezoelectric layer 20 in the −X axis direction is located between, for example, the end of the first electrode in the −X axis direction and the end of the pressure generating chamber 211 in the +X axis direction. The end of the first electrode 10 in the −X axis direction is not covered with the piezoelectric layer 20.

The second electrode 30 is continuously provided at, for example, the piezoelectric layer 20 and the diaphragm 230. The second electrode 30 serves as a common electrode common to the plurality of piezoelectric elements 100.

The protective substrate 240 is joined to the diaphragm 230 by an adhesive 203. The protective substrate 240 is provided with a through hole 242. In the example, the through hole 242 penetrates the protective substrate 240 in a Z axis direction and communicates with the third communication passage 215. The through hole 242 and the third communication passage 215 constitute the manifold 216 that is the common liquid chamber for the pressure generating chamber 211. Further, the protective substrate 240 is provided with a through hole 244 that penetrates the protective substrate 240 in the Z axis direction. An end of the lead electrode 202 is located in the through hole 244.

The protective substrate 240 is provided with an opening portion 246. The opening portion 246 is a space for not hindering the driving of the piezoelectric element 100. The opening portion 246 may or may not be sealed.

The circuit board 250 is provided at the protective substrate 240. The circuit board 250 includes a semiconductor integrated circuit (IC) for driving the piezoelectric element 100. The circuit board 250 and the lead electrode 202 are electrically coupled via a connection wiring 204.

The compliance substrate 260 is provided at the protective substrate 240. The compliance substrate 260 includes a sealing layer 262 provided at the protective substrate 240 and a fixing plate 264 provided at the sealing layer 262. The sealing layer 262 is a layer for sealing the manifold 216. The sealing layer 262 has, for example, flexibility. The fixing plate 264 is provided with a through hole 266. The through hole 266 penetrates the fixing plate 264 in the Z axis direction. The through hole 266 is provided at a position where the through hole 266 overlaps the manifold 216 when viewed from the Z axis direction.

4. Printer

Figure 7:
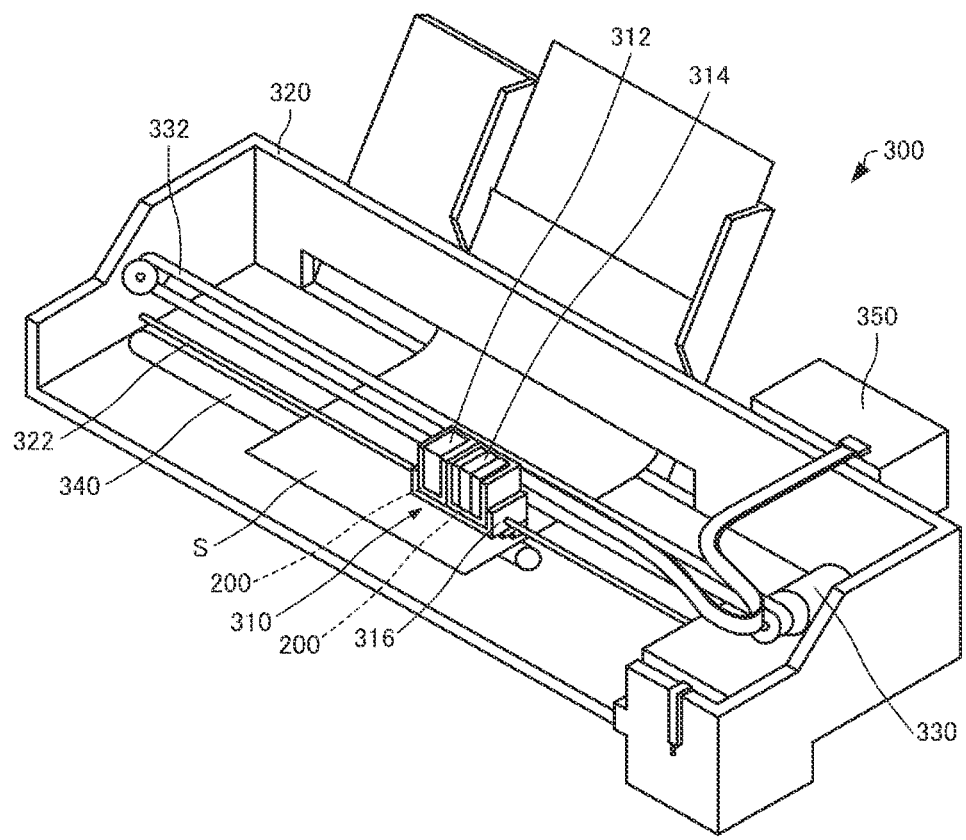
FIG. 7 is a perspective view schematically showing a printer according to the present embodiment.

Next, a printer according to the present embodiment will be described with reference to the drawings. FIG. 7 is a perspective view schematically showing a printer 300 according to the present embodiment.

The printer 300 is an inkjet printer. The printer 300 includes a head unit 310, as shown in FIG. 7. The head unit 310 includes, for example, the liquid discharge head 200. The number of liquid discharge heads 200 is not particularly limited. The head unit 310 is detachably provided with cartridges 312 and 314 that form a supply unit. A carriage 316 on which the head unit 310 is mounted is provided at a carriage shaft 322 attached to an apparatus main body 320 so as to be movable in an axial direction, and discharges the liquid supplied from a liquid supply unit.

Here, the liquid may be a material in a state when a substance is in a liquid phase, and a material in a liquid state such as a sol or a gel is also included in the liquid. Further, the liquid includes not only the liquid as a state of the substance but also a liquid in which particles of a functional material made of a solid substance such as a pigment or a metal particle are dissolved, dispersed or mixed in a solvent. Typical examples of the liquid include inks and liquid crystal emulsifiers. The inks include general water-based inks, oil-based inks, and various liquid compositions such as gel inks and hot melt inks.

In the printer 300, a driving force of a drive motor 330 is transmitted to the carriage 316 via a plurality of gears and a timing belt 332 (not shown), so that the carriage 316 equipped with the head unit 310 is moved along the carriage shaft 322. On the other hand, the apparatus main body 320 is provided with a transport roller 340 as a transport mechanism for relatively moving a sheet S, which is a recording medium such as paper, with respect to the liquid discharge head 200. The transport mechanism that transports the sheet S is not limited to the transport roller, and may be a belt, a drum, or the like.

The printer 300 includes a printer controller 350 serving as a control unit that controls the liquid discharge head 200 and the transport roller 340. The printer controller 350 is electrically coupled to the circuit board 250 of the liquid discharge head 200. The printer controller 350 includes, for example, a random access memory (RAM) that temporarily stores various data, a read only memory (ROM) that stores a control program, a central processing unit (CPU), and a drive signal generation circuit that generates a drive signal for supplying to the liquid discharge head 200.

The piezoelectric element 100 is not limited to the liquid discharge head and the printer, and can be used in a wide range of applications. The piezoelectric element 100 is preferably used as a piezoelectric actuator such as an ultrasonic motor, a vibration dust removing device, a piezoelectric transformer, a piezoelectric speaker, a piezoelectric pump, and a pressure-electric conversion device. Further, the piezoelectric element 100 is preferably used as a piezoelectric sensor element such as an ultrasonic detector, an angular velocity sensor, an acceleration sensor, a vibration sensor, a tilt sensor, a pressure sensor, a collision sensor, a human sensor, an infrared sensor, a terahertz sensor, a heat detection sensor, a pyroelectric sensor, and a piezoelectric sensor. Further, the piezoelectric element 100 is preferably used as a ferroelectric element such as a ferroelectric memory (FeRAM), a ferroelectric transistor (FeFET), a ferroelectric arithmetic circuit (FeLogic), and a ferroelectric capacitor. Further, the piezoelectric element 100 is preferably used as a voltage control type optical element such as a wavelength converter, an optical waveguide, an optical path modulator, a refractive index control element, and an electronic shutter mechanism.

5. Examples and Comparative Examples

5.1. Preparation of Sample

5.1.1. Example 1

In Example 1, first, a surface of a single crystal silicon substrate was thermally oxidized to form a $SiO_2$ layer having a thickness of 1460 nm. Next, a Zr layer having a thickness of 400 nm was formed by a direct current (DC) sputtering method, and a $ZrO_2$ layer was formed by a heat treatment at 850° C. In addition, a Ti layer and a Pt layer of 20 nm and 80 nm, respectively, were formed by the DC sputtering method.

Next, a surface of the Pt layer was irradiated with ultraviolet rays for 10 minutes in vacuum, and then exposed to a nitrogen atmosphere for 1 minute to clean the surface of the Pt layer. Then, a KNN precursor solution was formed into a 70 nm film by the spin coating method, and the KNN layer was formed by lamp annealing at 750° C. for 3 minutes in an oxygen atmosphere. The KNN precursor solution was adjusted so that (K+Na):Nb=104:100 and K:Na=50:50. Next, a layer above a $ZrO_2$ layer was patterned by ion milling. Next, the KNN precursor solution having the same composition as described above was formed into a total 400 nm film by the spin coating method of 11 layers. Each layer was lamp-annealed in the oxygen atmosphere at 750° C. for 3 minutes to crystallize the KNN layer.

Next, a 45 nm Pt layer was formed by the DC sputtering method. In a plan view, a diameter of the second electrode was set to 500 μm.

5.1.2. Example 2

In Example 2, the KNN layer satisfying (K+Na):Nb=104:100 and K:Na=35:65 was formed in the same manner as in Example 1 except that the KNN layer was formed in 1 μm by the sputtering method.

5.1.3. Comparative Example 1

In Comparative Example 1, the KNN precursor solution was prepared in the same manner as in Example 1 except that the KNN precursor solution was adjusted to satisfy (K+Na):Nb=100:100 and K:Na=35:65.

5.1.4. Comparative Example 2

In Comparative Example 2, in the same manner as in Example 1, a Ti layer, a Pt layer, an Ir layer, and a Ti layer were formed, and then a PZT precursor solution was formed into a 110 nm film by the spin coating method to form a PZT layer by the lamp annealing in the oxygen atmosphere at 737° C. for 5 minutes. The PZT precursor solution was adjusted so that Pb:Zr:Ti=118:52:48. Next, the layer above the $ZrO_2$ layer was patterned by the ion milling. Next, the ZPT precursor solution having the same composition as described above was formed into a total 1085 nm film by the spin coating method of 5 layers. The layers were lamp-annealed in the oxygen atmosphere at 737° C. for 5 minutes to crystallize the PZT layer.

In addition, the Ir layer and the Ti layer of 5 nm and 4 nm, respectively, were formed by the DC sputtering method. Next, the lamp annealing was performed at 740° C. for 8 minutes in the nitrogen atmosphere. Then, the PZT layer, the Ir layer, and the Ti layer were patterned by the ion milling. Next, the Ir layer and the Ti layer of 6 nm and 25 nm, respectively, were formed and patterned by the ion milling.

5.2. Evaluation on Hysteresis Curve

As shown in FIG. 2, the positive predetermined voltage at which each sample was sufficiently polarized was applied to the piezoelectric layer for 1 millisecond, the voltage applied to the piezoelectric layer is set to 0 V for 0.1 seconds, and then the triangular wave voltage waveform having 0 V, the negative voltage, 0 V, the positive voltage, and 0 V was applied to the piezoelectric layer. As a result, the hysteresis curve was obtained.

Figure 8:
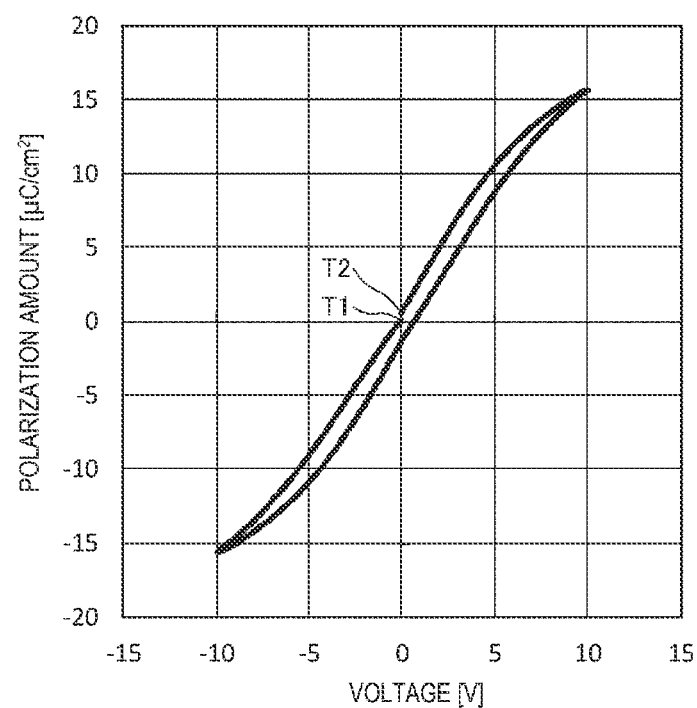
FIG. 8 is a hysteresis curve of Example 1.
Figure 9:
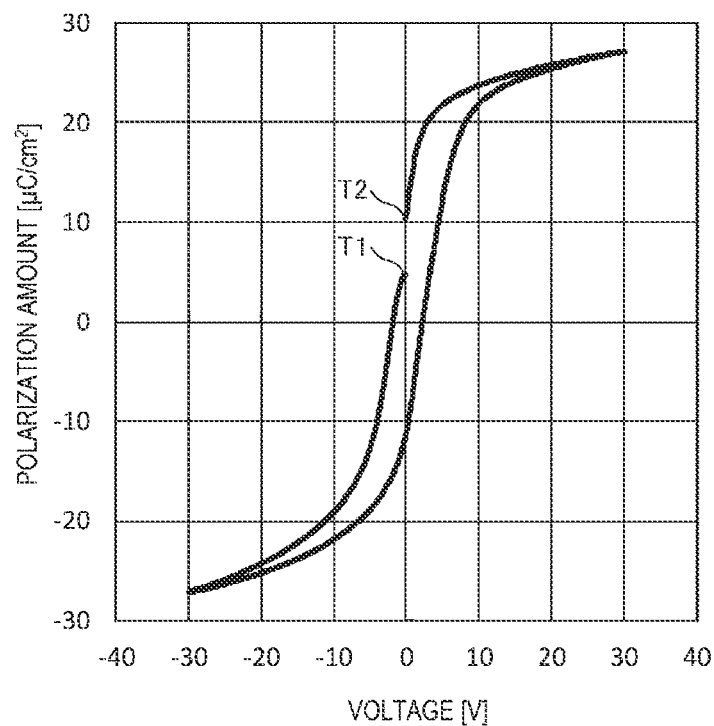
FIG. 9 is a hysteresis curve of Example 2.
Figure 10:
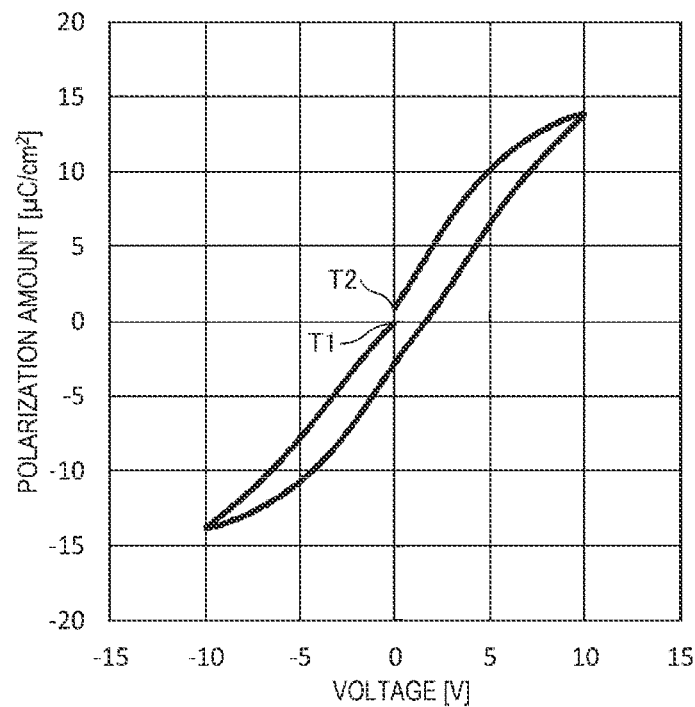
FIG. 10 is a hysteresis curve of Comparative Example 1.
Figures 11, 12:
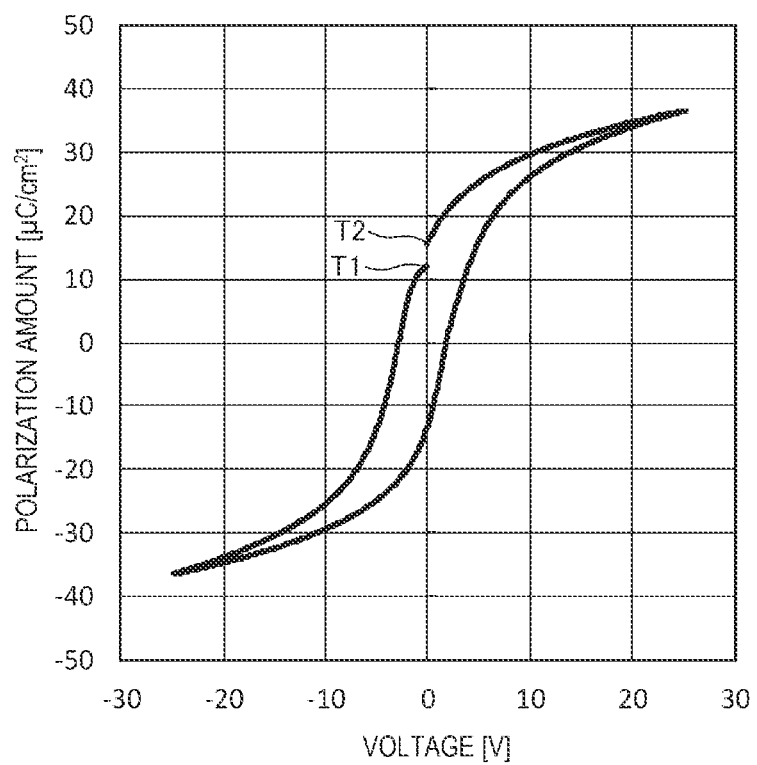
FIG. 11 is a hysteresis curve of Comparative Example 2.
FIG. 12 is a table showing evaluation results.

FIG. 8 is the hysteresis curve of Example 1. FIG. is the hysteresis curve of Example 2. FIG. 10 is the hysteresis curve of Comparative Example 1. FIG. 11 is the hysteresis curve of Comparative Example 2. FIG. 12 is a table showing evaluation results obtained by plotting values of FIGS. 8 to 11.

FIG. 12 shows the residual polarization amount P1 at the start point T1 of the hysteresis curve, the residual polarization amount P2 at the end point T2 of the hysteresis curve, and P1/P2. Further, FIG. 12 shows a residual polarization amount P3 at the start point T1 of the hysteresis curve obtained when a period in which no voltage is applied to the piezoelectric layer is set to 1 second instead of 0.1 seconds after applying the positive predetermined voltage to the piezoelectric layer in each sample.

Further, FIG. 12 shows a piezoelectric constant $d_{31}$. In a measurement of the piezoelectric constant, first, each sample was cut out in a strip shape having a length of 15 mm and a width of 4 mm in a plan view to prepare a cantilever with one end portion fixed. Then, a voltage waveform of a sine wave of 0 V, the positive voltage, and 0 V is continuously applied to one electrode, and an amount of movement (a displacement amount) of the fixed end portion and the opposite end portion was measured by a laser, and the piezoelectric constant $d_{31}$ was obtained by calculation.

Further, FIG. 12 shows the leak current after 60 seconds when an electric field of 200 kV/cm was applied to each sample at a room temperature.

As shown in FIG. 12, Comparative Example 1 in which P1/P2 is negative had a smaller absolute value of the piezoelectric constant than Examples 1 and 2 in which P1/P2 has a positive value. In Comparative Example 1, it is considered that since P1/P2 is negative, an effect of a polarization processing (polling) is lost, and when the positive voltage is applied to drive the piezoelectric element, the electrical energy is used to determine the polarization direction, which leads to a corresponding loss and a smaller absolute value of the piezoelectric constant.

Further, as shown in FIG. 12, the leak current of Examples 1 and 2 was smaller than that of Comparative Examples 1 and 2. It is considered that P1/P2 depends on the magnitude of the leak current, and P1/P2 can be controlled by adjusting the leak current. Moreover, no significant difference was confirmed between P1 and P3.

Figure 13:
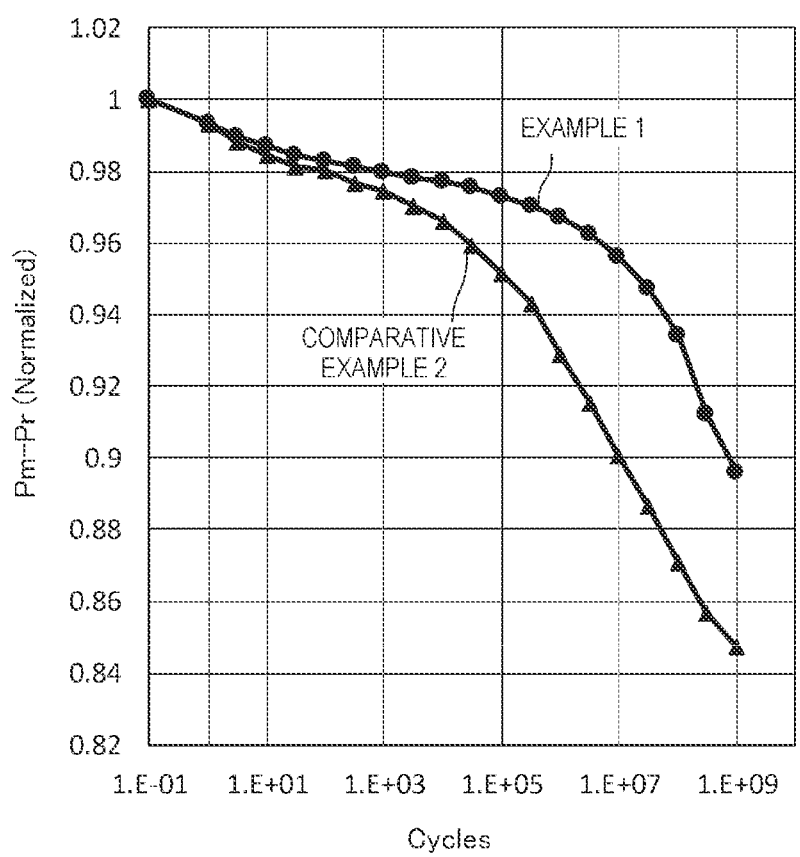
FIG. 13 is a graph showing (Pm−Pr) variation in Example 1 and Comparative Example 2.

FIG. 13 is a graph showing (Pm−Pr) fluctuations when a single-pole square pulse of 50 kHz was continuously applied at corresponding operating voltages in Example 1 and Comparative Example 2. Pm is a polarization amount when the maximum positive voltage is applied. Pr is the residual polarization amount. A difference between Pm and Pr (Pm−Pr) is said to be a measure of the fluctuations in the operation of the piezoelectric element. A horizontal axis of FIG. 13 is the number of square pulses. A vertical axis of FIG. 13 is a value standardized by an initial value of (Pm−Pr).

As shown in FIG. 13, in 1 billion pulses, a characteristic variation of about 15% was observed in Comparative Example 2, whereas a characteristic variation was suppressed to about 10% in Example 1. In Comparative Example 2, as shown in FIG. 12, P1/P2 is 0.5 or more, and the residual polarization amount is large, and thus it is considered that an influence of the imprint phenomenon is large.

From the above description, it was found that by satisfying $0<P1/P2\leq 0.5$ and P1>0, the absolute value of the piezoelectric constant is large and the fluctuation of the piezoelectric characteristics due to the imprint phenomenon can be prevented.

The present disclosure is not limited to the above-described embodiments, and various modifications can further be made. For example, the present disclosure includes a configuration substantially the same as the configuration described in the embodiments. The substantially same configuration is, for example, a configuration having the same function, method and result, or a configuration having the same object and effect. The present disclosure includes a configuration in which a non-necessary portion of the configuration described in the embodiments is replaced. In addition, the present disclosure includes a configuration having the same operation effect as the configuration described in the embodiments, or a configuration capable of achieving the same object. The present disclosure includes a configuration in which a known technique is added to the configuration described in the embodiments.

The following contents are derived from the above embodiments.

A piezoelectric element according to an aspect includes: a first electrode and a second electrode; and a piezoelectric layer provided between the first electrode and the second electrode and having a perovskite structure, in which when a positive predetermined voltage is applied to the piezoelectric layer, a voltage applied to the piezoelectric layer is set to 0 V and is allowed to elapse for 0.1 seconds, and then a triangular wave voltage waveform having a maximum voltage of the predetermined voltage is applied to the piezoelectric layer to obtain a hysteresis curve drawn counter-clockwise, $0<P1/P2\leq 0.5$ and $0<P1$ are satisfied assuming that a residual polarization amount at a start point of the hysteresis curve is P1 and a residual polarization amount at an end point of the hysteresis curve is P2.

According to the piezoelectric element, the absolute value of the piezoelectric constant is large, and the fluctuations in the piezoelectric characteristics due to the imprint phenomenon can be prevented.

In the piezoelectric element of the aspect, the piezoelectric layer may include potassium, sodium and niobium.

A liquid discharge head according to an aspect includes: a piezoelectric element according to the aspect; a flow path forming substrate provided with a pressure generating chamber whose volume changes due to the piezoelectric element; and a nozzle plate provided with a nozzle hole communicating with the pressure generating chamber.

A printer according to an aspect includes: a liquid discharge head according to the aspect; a transport mechanism configured to relatively move a recording medium with respect to the liquid discharge head; and a control unit configured to control the liquid discharge head and the transport mechanism.

What is claimed is:

1. A piezoelectric element comprising:
a first electrode and a second electrode; and
a piezoelectric layer provided between the first electrode and the second electrode, the piezoelectric layer having a defect and having a perovskite structure, wherein $0<P1/P2\leq 0.5$ and $0<P1$, and wherein, upon application of a positive predetermined voltage to the piezoelectric layer, then application of a voltage to the piezoelectric layer that is set to 0 V for 0.1 seconds, and then application of a triangular wave voltage waveform having a maximum voltage of the predetermined voltage to the piezoelectric layer, the piezoelectric layer exhibits a hysteresis curve drawn counterclockwise that includes a start point and an end point and an end point that are separated from each other with no portion of the hysteresis curve being located therebetween, P1 is a residual polarization amount at the start point of the hysteresis curve and P2 is a residual polarization amount at the end point of the hysteresis curve.

2. The piezoelectric element according to claim 1, wherein
the piezoelectric layer includes potassium, sodium and niobium.

3. A liquid discharge head comprising:
the piezoelectric element according to claim 1;
a flow path forming substrate provided with a pressure generating chamber whose volume changes due to the piezoelectric element; and a nozzle plate provided with a nozzle hole communicating with the pressure generating chamber.

4. A printer comprising:

the liquid discharge head according to claim 3;

a transport mechanism configured to relatively move a recording medium with respect to the liquid discharge head; and a control unit configured to control the liquid discharge head and the transport mechanism.

5. The piezoelectric element according to claim 2, wherein the potassium and the sodium are located at an A site of the perovskite structure and the niobium is located at a B site of the perovskite structure, and a ratio $D_A/D_B$ of an atomic concentration $D_A$ at the A site to an atomic concentration $D_B$ at the B site is 1.01 or more and 1.10 or less.

* * * * *